United States Patent [19]
Reichle

[11] Patent Number: 6,027,347
[45] Date of Patent: Feb. 22, 2000

[54] PROCESS AND ARRANGEMENT FOR CONNECTING A PLURALITY OF MUTUALLY REMOTE ELECTRIC CONTACT POINTS

[75] Inventor: Hans Reichle, Wetzikon, Switzerland

[73] Assignee: Reichle + de Massari AG Elektro-Ingenieure, Wetzikon, Switzerland

[21] Appl. No.: 08/860,438

[22] PCT Filed: Oct. 24, 1996

[86] PCT No.: PCT/CH96/00375

§ 371 Date: Aug. 26, 1997

§ 102(e) Date: Aug. 26, 1997

[87] PCT Pub. No.: WO96/40955

PCT Pub. Date: Dec. 19, 1996

[30] Foreign Application Priority Data

Oct. 26, 1995 [CH] Switzerland .............................. 3024/95

[51] Int. Cl.[7] ...................................................... H01R 9/09
[52] U.S. Cl. ................................................................ 439/77
[58] Field of Search ................................ 439/77, 638, 676

[56] References Cited

U.S. PATENT DOCUMENTS

| | | | |
|---|---|---|---|
| 3,579,206 | 5/1971 | Grange | 439/77 |
| 3,621,116 | 11/1971 | Adams | 174/68.5 |
| 4,418,239 | 11/1983 | Larson et al. | 174/34 |
| 4,806,106 | 2/1989 | Mebane et al. | 439/77 |
| 5,186,632 | 2/1993 | Horton et al. | 439/74 |
| 5,421,741 | 6/1995 | David et al. | 439/77 |

Primary Examiner—Steven L. Stephan
Assistant Examiner—J. F. Duverne
Attorney, Agent, or Firm—Venable; George H. Spencer; Catherine M. Voorhees

[57] ABSTRACT

In a connection device with a number of spaced and through-connected electrical contacts, the contacts are through-connected by means of band-shaped flexible printed conductor foil, whereby at least partially electrically separable contacts are through-connected via a number of at least partially parallel printed conductors on the printed conductor foil and whereby printed conductor sections create direct plugged contacts tacts in the plug areas of modular plugging and/or socket means of the connection device.

2 Claims, 1 Drawing Sheet

PROCESS AND ARRANGEMENT FOR CONNECTING A PLURALITY OF MUTUALLY REMOTE ELECTRIC CONTACT POINTS

BACKGROUND OF THE INVENTION.

The present invention relates to a method of through-connecting spaced electrical contacts with band-shaped flexible printed conductor foil.

Internal connections of spaced solderless contacts along the shortest paths possible, with as few crossings as possible and with the least possible capacitive coupling are required in many areas of electrical engineering and electronics. Furthermore, the greatest possible degree of miniaturization and modular construction are also desirable. This is virtually impossible to achieve with conventional wiring technology.

SUMMARY OF THE INVENTION.

Therefore, the purpose of the present invention is to create a method which permits the preferably solderless internal connection of spaced contacts along the shortest paths, with as few crossings as possible and with the least possible capacitive coupling.

This is made possible according to the invention in that contacts which are electrically separable to at least some extent are through-connected via at least partially parallel printed conductors on the printed conductor foil, whereby printed conductor sections in the plug areas of modular plugs and/or sockets form direct plugged contacts.

In this case, holding the printed conductors apart by means of plastic ribs at least in the plug areas and subjecting the printed conductor sections which form the plugged contacts to at least some extent to the effects of springs which create contact pressure is preferable.

Furthermore, the possibility of transferring printed conductor sections via contact means such as pins, etc. to another contact level is preferable for permitting a variable construction of suitable adapters, etc.

In addition, the possibility of cross-jointing the printed conductors wherever desired is essential, and the printed conductor foil is provided with at least one lateral downward projection with additional transverse printed conductors and/or the printed conductor foil is provided with a preferably swivelable slip ring which connects at least some of the parallel printed conductors for this purpose. Furthermore, the parallel printed conductors can be connected with cross bridges for cross-joints for the purpose of creating various connection paths for interrupting the line wherever desired. In addition, subjecting the cross-joints transpositions to contact pressure is preferable.

Furthermore, the present invention relates to a connection device with a number of spaced and throughconnected electrical contacts using the method according to the invention.

This connection device is characterized in that the contacts are through-connected by means of band-shaped flexible printed conductor foil with a number of at least partially parallel printed conductors, whereby printed conductor sections form direct plugged contacts in the plug areas of modular plugging and/or socket means of the connection device.

BRIEF DESCRIPTION OF THE DRAWINGS.

Examples of embodiments of the object of the invention are illustrated in more detail on the basis of the drawings, in which.

DETAILED DESCRIPTION OF THE INVENTION.

Figure 1:
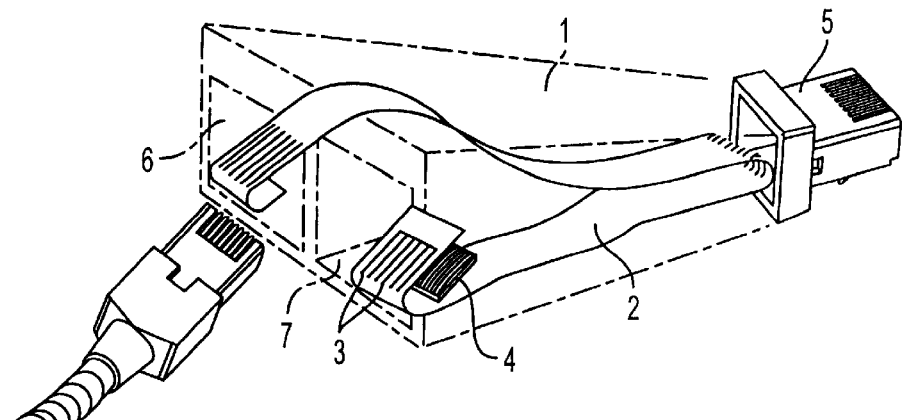
FIG. 1 is a diagram of the connection device according to the invention which illustrates the method according to the invention for through-connecting a number of spaced electrical contacts.
Figure 2:
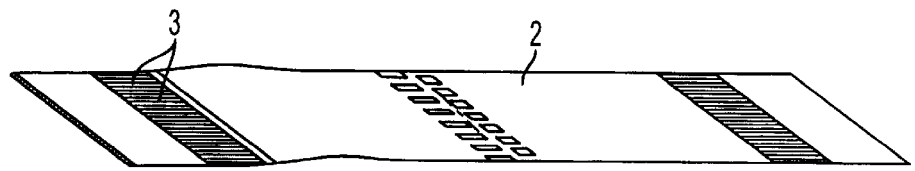
FIG. 2 is a diagram of a flexible printed conductor foil with a number of at least partially parallel printed conductors for executing the method according to the invention.

Using the connection device 1 shown in the diagram in FIG. 1, a double adapter in this case, the through-connection of the spaced electrical contacts is created with a band-shaped flexible printed conductor foil 2 with a number of at least partially parallel printed conductors 3, whereby printed conductor sections form direct plugged contacts in the plug areas of modular plugging and/or socket connection means 5,6,7.

This type of through-connection of a number of spaced electrical contacts according to the invention by means of band-shaped flexible printed conductor foil with a number of at least partially parallel printed conductors permits the creation of solderless, internal connections of spaced contacts on the shortest possible path, without crossings and with the least possible capacitive coupling.

In this case, the printed conductor foil 2 comprises electrically non-conductive base material provided with the printed conductors 3, whereby the individual printed conductors in the contact area are exposed through etching or mechanical methods or by not being covered.

Contact closure between adjacent printed conductors is then prevented in that the exposed printed conductors are kept apart by plastic ribs (not shown).

As shown in FIG. 1, such a printed conductor foil can connect the various contact areas, in this example a plug side 5 with two socket sides 6 and 7, by being appropriately folded and/or twisted.

Furthermore, exerting sufficient contact pressure on the relatively small conductor surfaces is essential when the exposed printed conductors are subjected to at least some extent to the effects of springs which create contact pressure, as is implied in FIG. 1 with a spring comb 4.

Figure 3:
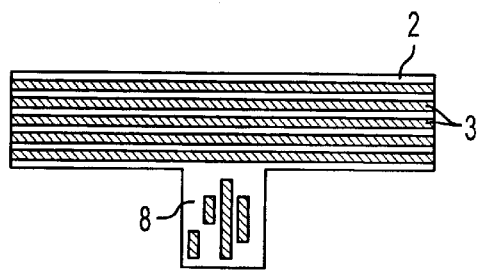
FIGS. 3, 4 and 5 are various embodiments of flexible printed conductor foils.
Figure 4:
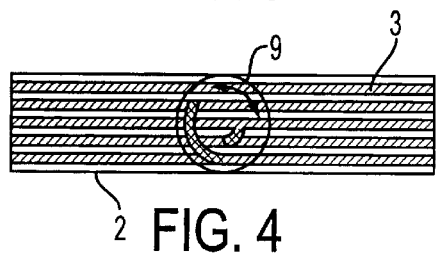
Figure 5:
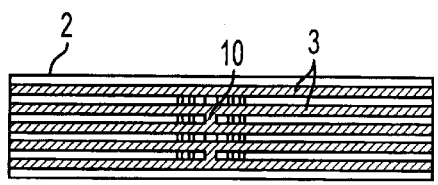

As shown in FIGS. 3, 4 and 5, further embodiments of various connections, especially when the printed conductors are cross-jointed transposed, are possible in that the printed conductor foil 2 is provided with at least one lateral downward projection 8 with additional transverse printed conductors, or in that the printed conductor foil is provided with a preferably swivelable slip ring 9 which connects at least some of the parallel printed conductors, or the parallel printed conductors 3 are connected by cross bridges 10.

These measures permit the creation of internal solderless connections between spaced contacts over the shortest path possible and with the least possible capacitive coupling, whereby a large number of variations are possible.

Furthermore, printed conductor sections can be transferred to another contact level via contact means such as pins, etc. for various constructions of suitable adapters, etc.

What is claimed is:

1. A connection device comprising:

a plurality of spaced-apart electrical contacts;

through-connected male and female contacts, wherein the through-connection is established by band-shaped flexible printed conductor foils with a plurality of at least partially parallel conductors, sections of said conductors being, at least in the plug areas of one of modular plugging means and socket means, exposed so as to form direct plugged contacts; and means for connecting parallel printed conductors by cross-jointing.

2. A connection device according to claim 1, further comprising spring means for exerting a contact pressure on at least some of said conductors.

* * * * *